US010942218B2

(12) United States Patent
Hashimoto et al.

(10) Patent No.: US 10,942,218 B2
(45) Date of Patent: Mar. 9, 2021

(54) LOAD BOARD AND ELECTRONIC COMPONENT TESTING APPARATUS

(71) Applicant: ADVANTEST Corporation, Tokyo (JP)

(72) Inventors: Takashi Hashimoto, Tokyo (JP); Keishi Oku, Tokyo (JP); Hiroaki Takeuchi, Tokyo (JP); Takatoshi Yoshino, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 59 days.

(21) Appl. No.: 16/351,363

(22) Filed: Mar. 12, 2019

(65) Prior Publication Data

US 2020/0033402 A1    Jan. 30, 2020

(30) Foreign Application Priority Data

Jul. 26, 2018   (JP) .............................. JP2018-140087

(51) Int. Cl.
*G01R 31/28* (2006.01)
*G05D 23/20* (2006.01)

(52) U.S. Cl.
CPC ..... *G01R 31/2874* (2013.01); *G05D 23/2033* (2013.01)

(58) Field of Classification Search
CPC ............ G01R 31/2874; G01R 31/2875; G05D 23/2033
See application file for complete search history.

(56) References Cited

U.S. PATENT DOCUMENTS

| 4,862,075 | A | * | 8/1989 | Choi ...................... | G01R 1/071 324/754.27 |
| 4,875,006 | A | * | 10/1989 | Henley ................. | G01R 1/071 324/97 |
| 5,465,850 | A | * | 11/1995 | Kase .................. | G01R 31/2851 209/573 |
| 6,119,255 | A | * | 9/2000 | Akram ............... | G01R 31/2862 324/750.05 |
| 6,545,494 | B1 | | 4/2003 | Olsen et al. | |
| 6,850,081 | B1 | * | 2/2005 | Birdsley .......... | G01R 31/31905 324/754.23 |

(Continued)

FOREIGN PATENT DOCUMENTS

CN    101248361 A    8/2008
JP    2004-503924 A   2/2004

(Continued)

OTHER PUBLICATIONS

Office Action issued in corresponding Taiwanese Patent Application No. 108107192 dated Sep. 23, 2019 (6 pages).

(Continued)

*Primary Examiner* — Patrick Assouad
*Assistant Examiner* — Demetrius R Pretlow
(74) *Attorney, Agent, or Firm* — Osha Bergman Watanabe & Burton LLP

(57) ABSTRACT

A load board to which a socket is mounted is electrically connected to a tester. The load board includes a first optical communication unit capable of transmitting and/or receiving signals by optical wireless communication with an electronic component handling apparatus that presses a DUT against the socket.

10 Claims, 5 Drawing Sheets

(56) References Cited

U.S. PATENT DOCUMENTS

| | | | |
|---|---|---|---|
| 2002/0026258 A1* | 2/2002 | Suzuki | B65G 57/04 |
| | | | 700/112 |
| 2002/0050834 A1 | 5/2002 | Olsen et al. | |
| 2003/0028836 A1* | 2/2003 | Maeda | G01R 31/31914 |
| | | | 714/724 |
| 2005/0192772 A1* | 9/2005 | Pepper | G01R 31/31926 |
| | | | 702/122 |
| 2008/0054917 A1* | 3/2008 | Henson | G01R 31/2889 |
| | | | 324/754.03 |
| 2008/0103619 A1* | 5/2008 | Beecher | G01R 31/2806 |
| | | | 700/109 |
| 2009/0051381 A1* | 2/2009 | Hosoda | G01R 1/0458 |
| | | | 324/750.02 |
| 2009/0230981 A1* | 9/2009 | Yasumura | G01R 31/2863 |
| | | | 324/756.03 |
| 2010/0264949 A1* | 10/2010 | Hobbs | G01R 31/2891 |
| | | | 324/750.05 |
| 2011/0126931 A1 | 6/2011 | Ide et al. | |
| 2012/0033208 A1* | 2/2012 | Hara | G02B 6/4292 |
| | | | 356/244 |
| 2012/0068728 A1* | 3/2012 | Kataoka | G01R 31/2887 |
| | | | 324/756.03 |
| 2015/0268295 A1 | 9/2015 | Sasaki et al. | |
| 2015/0276847 A1* | 10/2015 | Salles | G01R 31/002 |
| | | | 324/762.01 |
| 2018/0136276 A1 | 5/2018 | Shimizu et al. | |

FOREIGN PATENT DOCUMENTS

| | | |
|---|---|---|
| JP | 4814051 B2 | 11/2011 |
| TW | 201140084 A | 11/2011 |
| TW | 2013-17595 A | 5/2013 |
| TW | 2016-02597 A | 1/2016 |
| TW | 201818053 A | 5/2018 |

OTHER PUBLICATIONS

Office Action and Search Report issued in corresponding Taiwanese Patent Application No. 108107192 dated Feb. 19, 2020 (6 pages).
Office Action issued in corresponding Taiwanese Patent Application No. 108107192, dated Jul. 24 2020 (8 pages).

* cited by examiner

LOAD BOARD AND ELECTRONIC COMPONENT TESTING APPARATUS

TECHNICAL FIELD

The present invention relates to a load board used for testing an electronic device (an electronic component) under test (hereinafter, referred to as a "device under test (DUT)" such as a semiconductor integrated circuit device and an electronic component testing apparatus including the same.

The present application claims priority from Japanese Patent Application No. 2018-140087 filed on Jul. 26, 2018. The contents described and/or illustrated in the documents relevant to the Japanese Patent Application No. 2018-140087 will be incorporated herein by reference as a part of the description and/or drawings of the present application.

BACKGROUND ART

There is known an apparatus where a DUT is attached to a socket installed on a circuit board, a tester acquires signals of a temperature sensing diode formed integrally with a chip die of the DUT via a connector on the circuit board, and the tester supplies a signal indicating the temperature of the DUT to a temperature controller (refer to, for example, Patent Document 1 (Paragraph and FIG. 5)).

CITATION LIST

Patent Document

Patent Document 1: JP 2004-503924 W

SUMMARY OF THE INVENTION

Problem to be Solved by the Invention

In a case where the DUT is of a type that self-heats rapidly in a short time, in order to perform the temperature control of the DUT at a high speed and with high accuracy, it is preferable that the supply source of the signal indicating the temperature of the DUT is set to the circuit board close to the DUT rather than the tester. However, in the electronic component testing apparatus, the circuit board on which the socket is installed is also exchanged along with the type exchange of the DUT or the like. For this reason, when the circuit board and the temperature controller are connected to each other via the cable, the attaching/detaching operation of the cable is troublesome, and there is a possibility that the operation rate of the electronic component testing apparatus is decreased.

The invention is to provide a load board capable of suppressing a decrease in operation rate of an electronic component testing apparatus, and an electronic component testing apparatus including the same.

Means for Solving Problem

[1] A load board according to the invention is a load board to which a socket is mounted and which is electrically connected to a tester, the load board including a first optical communication unit capable of transmitting and/or receiving signals by optical wireless communication with an electronic component handling apparatus that presses a DUT against the socket.

[2] In the above invention, the first optical communication unit may be capable of transmitting a first signal indicating a junction temperature of the DUT and capable of transmitting a second signal indicating a detection value of a temperature detection circuit included in the DUT.

[3] In the above invention, the load board may include: a first calculator calculating the junction temperature from the detection value of the temperature detection circuit and outputting the junction temperature to the first optical communication unit; a converter A/D-converting the detection value of the temperature detection circuit and outputting the A/D-converted detection value to the first optical communication unit; and a first switch switching a connection destination of the temperature detection circuit to the first calculator or the converter.

[4] An electronic component testing apparatus according to the invention is an electronic component testing apparatus including: the above-described load board to which a socket is mounted; a tester being electrically connected to the load board and testing a DUT; and an electronic component handling apparatus handling the DUT and pressing the DUT against the socket, in which the electronic component handling apparatus includes a second optical communication unit capable of receiving and/or transmitting signals by optical wireless communication with the first optical communication unit, and the second optical communication unit is provided at a position facing the first optical communication unit in the electronic component handling apparatus.

[5] In the above invention, the second optical communication unit may be capable of receiving the first signal and the second signal from the first optical communication unit, and the electronic component handling apparatus may include: a temperature adjuster adjusting the temperature of the DUT; a second calculator calculating the temperature of the DUT by using the first signal and the second signal; and a temperature controller controlling the temperature adjuster by using a calculation result of the second calculator.

[6] In the above invention, the electronic component handling apparatus may include a temperature sensor provided in a pusher contacting the DUT, the first optical communication unit may be capable of transmitting a third signal outputted from the tester, the second optical communication unit may be capable of receiving the third signal from the first optical communication unit, and the temperature controller may control the temperature adjuster on the basis of the third signal by using the calculation result of the second calculator or a detection value of the temperature sensor.

[7] In the above invention, the temperature controller may include a second switch switching an input source to the temperature controller to the second calculator or to the temperature sensor.

[8] In the above invention, the first optical communication unit may be capable of transmitting a fourth signal outputted from the tester, the second optical communication unit may be capable of receiving the fourth signal from the first optical communication unit, and the temperature controller may control the temperature adjuster on the basis of the fourth signal so that cooling or heating of the DUT is forcibly started.

[9] In the above invention, the second calculator may calculate the temperature of the DUT by correcting the first signal by using the second signal.

[10] In the above invention, the second calculator may calculate the temperature of the DUT by correcting the second signal by using the first signal.

Effect of the Invention

According to the invention, the load board includes a first optical communication unit capable of transmitting and/or receiving signals by optical wireless communication with the electronic component handling apparatus. For this reason, in the invention, since the attaching/detaching operation of the cable is unnecessary at all, it is possible to suppress a decrease in operation rate of the electronic component testing apparatus.

MODE(S) FOR CARRYING OUT THE INVENTION

Hereinafter, embodiments of the invention will be described with reference to the drawings.

Figure 1:
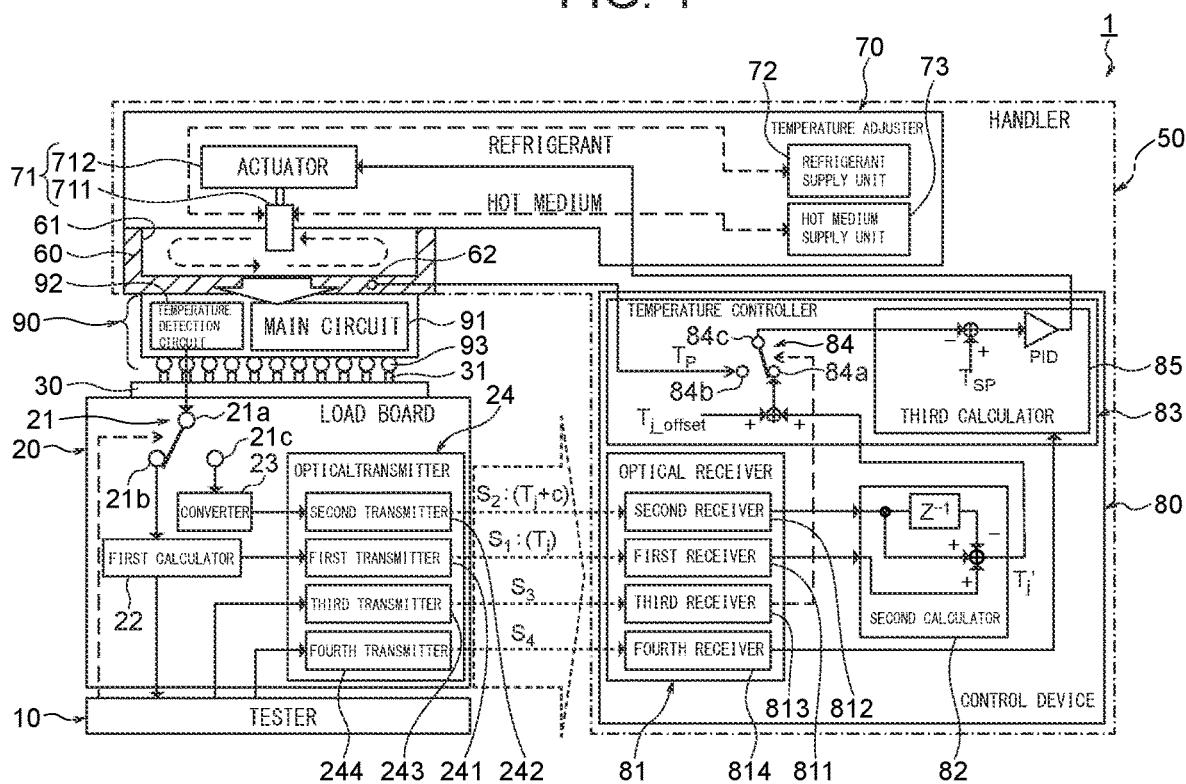
FIG. 1 is a block diagram illustrating a configuration of an electronic component testing apparatus in an embodiment of the invention.
Figure 2:
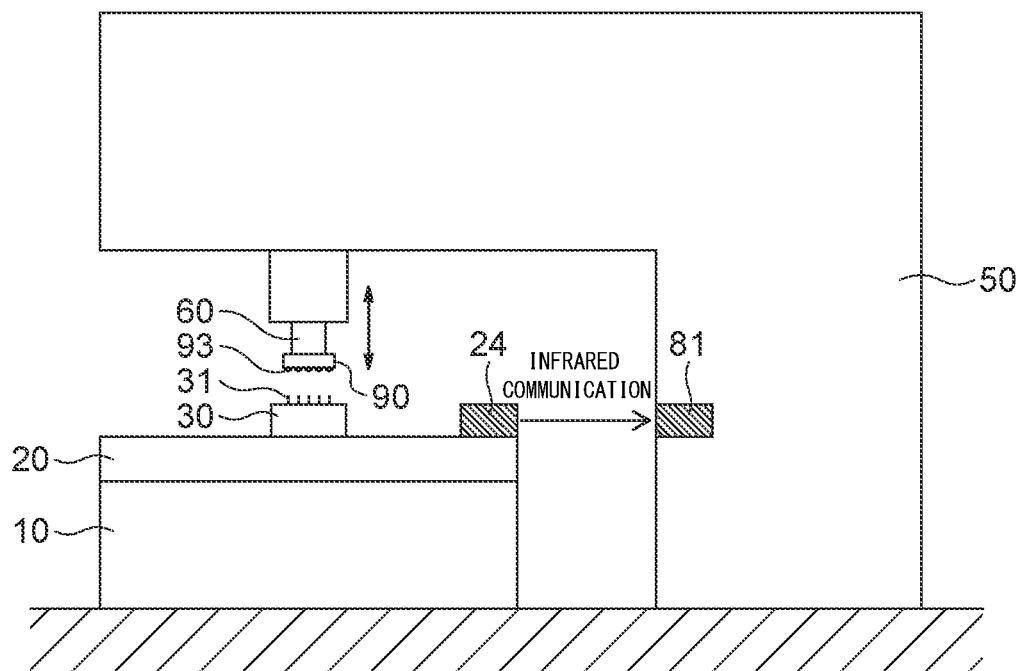
FIG. 2 is a schematic side view illustrating the electronic component testing apparatus in the embodiment of the invention.
Figure 3:
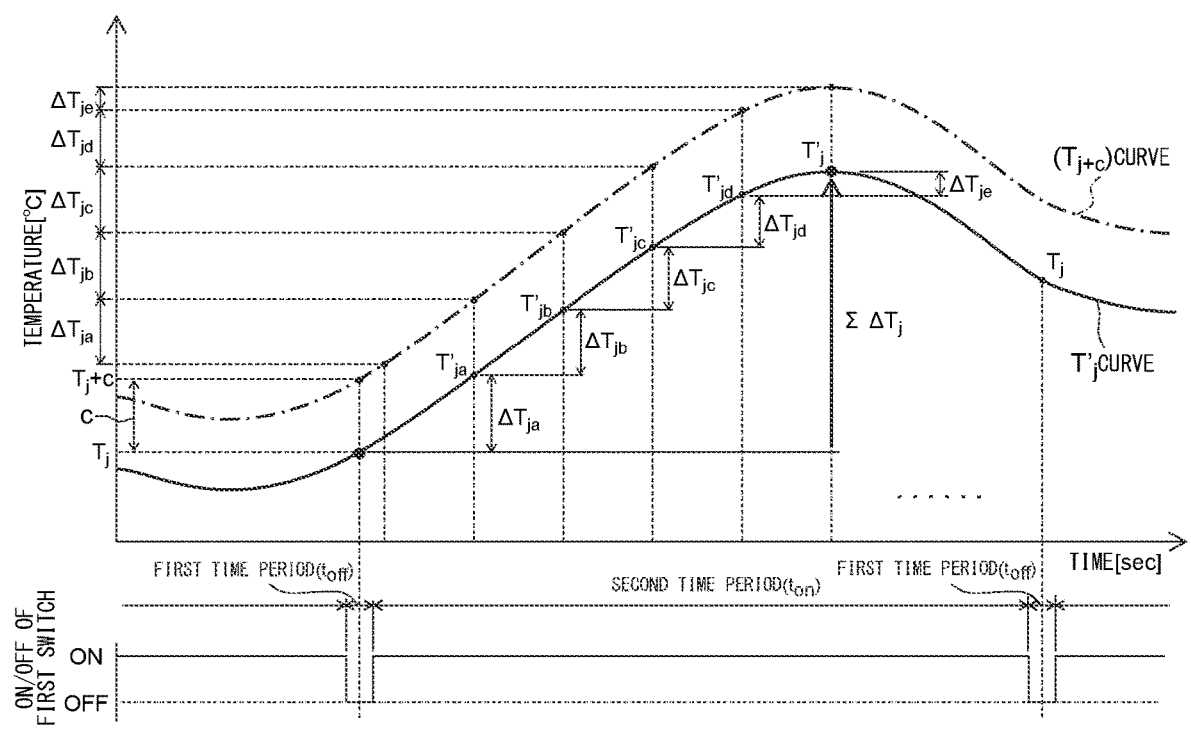
FIG. 3 is a view illustrating a method of calculating a DUT temperature $T_j'$ in the embodiment of the invention.
Figure 4:
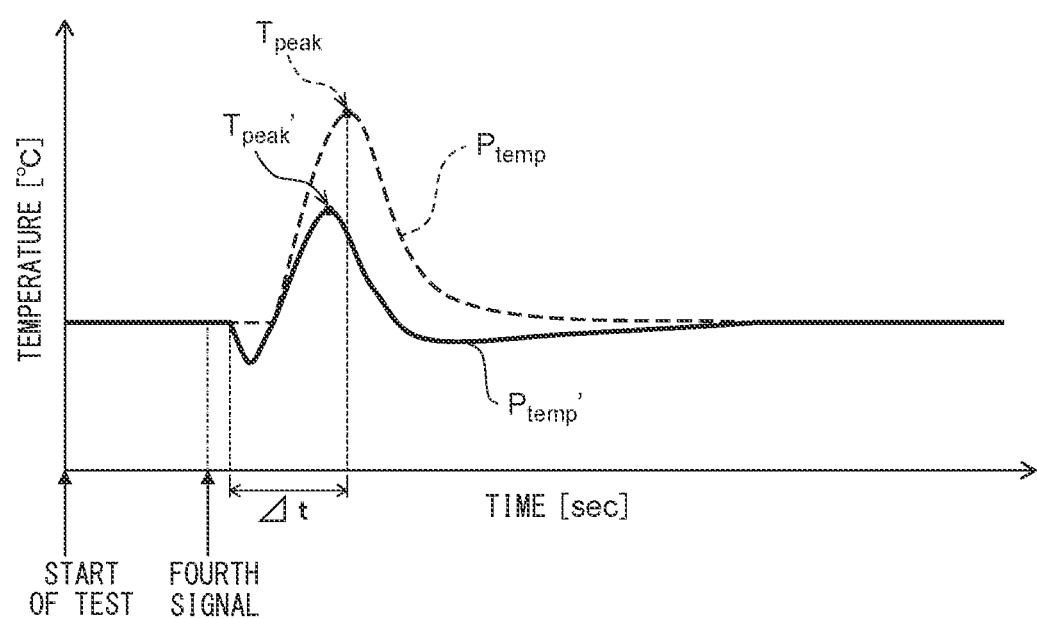
FIG. 4 is a view illustrating a pre-trigger function in the embodiment of the invention.

FIG. 1 is a block diagram illustrating a configuration of an electronic component testing apparatus in an embodiment of the invention, FIG. 2 is a schematic side view illustrating the electronic component testing apparatus in the embodiment of the invention, FIG. 3 is a view illustrating a method of calculating a DUT temperature $T_j'$ in the embodiment, and FIG. 4 is a view illustrating a pre-trigger function in the embodiment.

The electronic component testing apparatus 1 of the embodiment is an apparatus for testing electrical characteristics of a DUT 90 such as a semiconductor integrated circuit device. As illustrated in FIG. 1, the DUT 90 of the embodiment includes a temperature detection circuit 92 for detecting a temperature of the DUT 90 in addition to a main circuit 91 to be tested by a tester 10.

The temperature detection circuit 92 of the embodiment is, for example, a circuit including a thermal diode, and is formed on a semiconductor substrate on which the main circuit 91 is formed. The temperature detection circuit 92 detects the temperature of the DUT 90 by utilizing the temperature dependency of a PN junction. The configuration of the temperature detection circuit 92 is not particularly limited to the above-described configuration. For example, the temperature detection circuit 92 may be configured using an element having temperature-dependent resistance characteristics or band gap characteristics. Alternatively, as the temperature detection circuit 92, a thermocouple may be buried in the DUT 90.

As illustrated in FIGS. 1 and 2, the electronic component testing apparatus 1 of the embodiment includes a tester 10 and a handler 50. The handler 50 of the embodiment corresponds to an example of the electronic component handling apparatus of the invention.

A load board (performance board) 20 is electrically connected to the tester 10, and a socket 30 is mounted on the load board 20. When the DUT 90 is pressed against the socket 30 by the handler 50, the DUT 90 and the tester 10 are electrically connected to each other via the socket 30 and the load board 20. Then, the tester 10 executes a test of the DUT 90 by inputting/outputting a test signal to/from the main circuit 91 of the DUT 90 via the load board 20 and the socket 30. In addition, a detection voltage signal of the temperature detection circuit 92 of the DUT 90 is taken into the load board 20 via the socket 30.

The handler 50 is a apparatus for handling the DUT 90 and is configured to supply the DUT 90 before the test to the socket 30 and to press the DUT 90 against the socket 30 or to classify the DUT 90 after the test according to the test result. The tester 10 and the handler 20 are connected to each other via a cable, not particularly illustrated, and thus, signals can be exchanged between the tester 10 and the handler 20.

As illustrated in FIG. 2, the load board 20 of the embodiment is provided on the tester 10 and is electrically connected to the tester 10 via a connector (not particularly illustrated) or the like. The tester 10 includes, for example, a work station or the like as a control unit.

In addition, the socket 30 is mounted on the load board 20. The socket 30 has a contact 31 arranged so as to correspond to the input/output terminal 93 of the DUT 90. When the DUT 90 is pressed against the socket 30 by the handler 50, the input/output terminal 93 of the DUT 90 comes into contact with the contact 31 of the socket 30, so that the DUT 90 and the socket 30 are electrically connected to each other.

As illustrated in FIG. 1, the load board 20 includes a first switch 21, a first calculator 22, a converter 23, and an optical transmitter 24. The optical transmitter 24 of the embodiment corresponds to an example of a first optical communication unit of the invention.

An input terminal 21a of the first switch 21 is electrically connected to the socket 30. In addition, one output terminal 21b of the first switch 21 is electrically connected to the first calculator 22. On the other hand, the other output terminal 21c of the first switch 21 is electrically connected to the converter 23. The first switch 21 is configured to selectively switch the output destination to the first calculator 22 or the converter 23 according to a control signal from the tester 10.

The detection voltage signal of the temperature detection circuit 92 is inputted to each of the first calculator 22 and the converter 23 via the socket 30 and the first switch 21. The detection voltage signal of the temperature detection circuit 92 is an analog signal.

The first calculator 22 has an A/D-conversion function for converting the detection voltage signal into a digital signal and also has a calculation function for obtaining a junction temperature $T_j$ by performing a predetermined correction process on the detection voltage signal. The first calculator 22 generates a first signal $S_1$ indicating the junction temperature $T_j$, outputs the first signal $S_1$ to the tester 10, and outputs the first signal $S_1$ to the optical transmitter 24. The junction temperature $T_j$ is a temperature of the semiconductor substrate in the DUT 90.

The converter 23 has an A/D-conversion function of converting the detection voltage signal of the temperature detection circuit 92 into a digital signal. The converter 23 converts the detection voltage signal of the temperature detection circuit 92 into a digital signal to generate a second signal $S_2$ and outputs the second signal $S_2$ to the optical transmitter 24. While the above first calculator 22 has a calculation function in addition to the A/D-conversion function, the converter 23 has only a function of converting the detection voltage signal of the temperature detection circuit 92 into a digital signal.

Herein, the junction temperature $T_j$ indicated by the first signal $S_1$ is the temperature of the DUT 90 calculated with high accuracy by the first calculator 22. On the other hand, the detection temperature ($T_j$+c) indicated by the second signal $S_2$ is not subjected to calculation such as correction and is the output itself of the temperature detection circuit 92. Since there is a difference in the presence or absence of such a correction process and there is a difference in the distance of a signal path, the detection temperature ($T_j$+c) indicated by the second signal $S_2$ contains an error c with respect to the junction temperature $T_j$ (refer to FIG. 3).

In the embodiment, the tester 10 can output a third signal $S_3$ and a fourth signal $S_4$ to the optical transmitter 24 of the load board 20. The third signal $S_3$ is a switching signal for switching the second switch 84 of the temperature controller 83 of the handler 50. On the other hand, the fourth signal $S_4$ is a control signal (pre-trigger signal) for forcibly starting cooling or heating of the DUT 90 by the temperature adjuster 70 of the handler 50. The third and fourth signals $S_3$ and $S_4$ will be described in detail later.

The optical transmitter 24 and an optical receiver 81 (described later) on the side of the handler 50 in the embodiment are configured with, for example, an infrared transmission/reception module capable of performing wireless communication by using infrared rays. For example, the optical transmitter 24 is configured with an infrared transmission module having an infrared LED that emits infrared rays, and the optical receiver 81 is configured with an infrared reception module having a phototransistor that can receive the infrared rays emitted by the optical transmitter 24. The wavelength of electromagnetic waves (light beams) used for wireless communication between the optical transmitter 24 and the optical receiver 81 is not particularly limited to the infrared rays, but for example, visible light may be used.

The optical transmitter 24 of the embodiment has four transmitters 241 to 244 functionally. The first transmitter 241 has a function of transmitting the first signal $S_1$ inputted from the first calculator 22 to the optical receiver 81 on the handler 50 side. The second transmitter 242 has a function of transmitting the second signal $S_2$ inputted from the converter 23 to the optical receiver 81. The third and fourth transmitters 243 and 244 have a function of transmitting the third and fourth signals $S_3$ and $S_4$ inputted from the tester 10 to the optical receiver 81, respectively.

As illustrated in FIG. 1, the handler 50 of the embodiment includes a pusher 60, a temperature adjuster 70, and a control device 80. The pusher 60 presses the DUT 90 against the socket 30 to electrically test the DUT 90 and the socket 30 in order to execute the test of the DUT 90. The temperature adjuster 70 adjusts the temperature of the DUT 90 by using a refrigerant and a hot medium in the state where the pusher 60 is in contact with the DUT 90. The control device 80 calculates the temperature $T_j'$ of the DUT 90 by using the first and second signals $S_1$ and $S_2$ transmitted from the load board 20 and controls the temperature adjuster 70 on the basis of the calculation result $T_j'$.

The pusher 60 is a member that comes into contact with the DUT 90 when the handler 50 presses the DUT 90 against the socket 30. For this reason, the pusher 60 has an internal space 61 to which the refrigerant and the hot medium are supplied from the temperature adjuster 70. In addition, a temperature sensor 62 is buried in the pusher 60. The detection signal of the temperature sensor 62 is outputted to the temperature controller 83.

The temperature adjuster 70 includes a flow rate adjustment unit 71, a refrigerant supply unit 72, and a hot medium supply unit 73. The internal space 61 of the pusher 60 communicates with the refrigerant supply unit 72 and the hot medium supply unit 73 through the flow rate adjustment unit 71. Although not particularly illustrated, the refrigerant supply unit 72 has, for example, a circulation path for supplying the liquid refrigerant to the internal space 61 of the pusher 60 and recovering the refrigerant from the internal space 61 and has a pump and a chiller and the like provided on the circulation path. Similarly, although not particularly illustrated, the hot medium supply unit 73 also has, for example, a circulation path for supplying the liquid hot medium to the internal space 61 of the pusher 60 and recovering the hot medium from the internal space 61 and has a pump and a boiler and the like provided on the circulation path.

By opening and closing a valve 711, the flow rate adjustment unit 71 can arbitrarily adjust the flow rate of the refrigerant supplied from the refrigerant supply unit 72 to the internal space 61 of the pusher 60 and the flow rate of the hot medium supplied from the hot medium supply unit 73 to the internal space 61 of the pusher 60. The valve 711 is connected to an actuator 712 such as a motor, and the valve 711 is operated to be opened and closed by rotating the valve 711 by the actuator 712. Then, in the state where the pusher 60 is in contact with the DUT 90, the control device 80 drives the actuator 712 to adjust the flow rates of the refrigerant and the hot medium, respectively, so that the temperature of the DUT 90 can be adjusted.

As a specific example of the temperature adjuster 70, for example, an apparatus described in U.S. patent application Ser. No. 12/742,178 (US patent application publication No. 2011/0,126,931 A) can be exemplified. The configuration of the temperature adjuster is not particularly limited to the above-description configuration. For example, instead of the valve 711 and the actuator 712, the flow rates of the refrigerant and the hot medium may be adjusted by using solenoid valves, respectively. As a specific example of the temperature adjuster having such a configuration, for example, an apparatus described in U.S. patent application Ser. No. 14/472,398 (US patent application publication No. 2015/0,268,295 A) can be exemplified. Alternatively, a thermostreamer, which uses a gas as a refrigerant and a hot medium, a heater, or the like may be used as a temperature adjuster.

As illustrated in FIG. 1, the control device 80 includes an optical receiver 81, a second calculator 82, and a temperature controller 83. The optical receiver 81 of the embodiment corresponds to an example of the second optical communication unit of the invention.

As illustrated in FIG. 2, the optical receiver 81 of the embodiment is provided at a position facing the optical transmitter 24 in the handler 50 so as to enable optical wireless communication with the optical transmitter 24 on the load board 20 side. As illustrated in FIG. 1, the optical receiver 81 has four receivers 811 to 814 functionally.

Specifically, the first receiver 811 receives the first signal $S_1$ from the first transmitter 241 of the optical transmitter 24 on the load board 20 side. The second receiver 812 receives the second signal $S_2$ from the second transmitter 242 of the optical transmitter 24. Then, the first and second receivers 811 and 812 output the first and second signals $S_1$ and $S_2$ to the second calculator 82, respectively.

On the other hand, the third receiver 813 receives the third signal $S_3$ from the third transmitter 243 of the optical transmitter 24. The fourth receiver 814 receives the fourth signal $S_4$ from the fourth transmitter 244 of the optical transmitter 24. Then, the third and fourth receivers 813 and 814 output the third and fourth signals $S_3$ and $S_4$ to the temperature controller 83, respectively.

The second calculator 82 calculates a current temperature $T_j'$ (hereinafter, also simply referred to as "DUT temperature $T_j'$") of the DUT 90 by using the first signal $S_1$ (junction temperature $T_j$) inputted from the first receiver 811 and the second signal $S_2$ (detection temperature $T_j$+c) inputted from the second receiver 812 in accordance with Mathematical Formula (1). FIG. 3 is a view illustrating a method of calculating the DUT temperature $T_j'$ in accordance with the following Mathematical Formula (1).

[Mathematical Formula 1]

$$\left. \begin{array}{l} T_j' = T_j + \sum \Delta T_j \\ \Delta T_j = (T_j + c) - z^{-1}(T_j + c) \end{array} \right\} \quad (1)$$

In the above-described Mathematical Formula (1), $T_j$ indicates the junction temperature immediately before turning on the first switch 21, $(T_j+c)$ indicates the latest sampled detection temperature, $z^{-1}(T_j+c)$ indicates the one-time preceding sampled detection temperature, and $\Sigma \Delta T_j$ indicates a sum of $\Delta T_j$ calculated from the detection temperature sampled from the first time to the latest time.

As illustrated in FIG. 1, the temperature controller 83 includes a second switch 84 and a third calculator 85.

One input terminal 84a of the second switch 84 is electrically connected to the second calculator 82. As illustrated in FIG. 1, the temperature controller 83 may have a function capable of adding an arbitrary offset value $T_{j\_offset}$ to the DUT temperature $T_j'$ calculated by the second calculator 82. On the other hand, the other input terminal 84b of the second switch 84 is electrically connected to the temperature sensor 62 provided in the pusher 60. An output terminal 84c of the second switch 84 is electrically connected to the third calculator 85.

In addition, the second switch 84 is connected to the third receiver 813 of the optical receiver 81 and is configured so as to selectively switch the input source to the third calculator 85 to the second calculator 82 or the temperature sensor 84 according to the third signal $S_3$ from the tester 10. That is, by switching the second switch 84, the tester 10 can switch the temperature (to be compared with a set point $T_{SP}$ to be described later) used for the temperature control of the temperature adjuster 70 to the DUT temperature $T_j'$ calculated by the second calculator 82 or the detection result $T_p$ detected by the temperature sensor 84.

In the normal state, since the temperature control of the DUT 90 is performed by using the DUT temperature Tj' calculated by the second calculator 82, the second switch 84 connects the second calculator 82 to the third calculator 85.

On the other hand, in the case of diagnosing the temperature detection circuit 92 or in the case of diagnosing contact between the DUT 90 and the socket 30, the detection voltage signal cannot be acquired from the temperature detection circuit 92. For this reason, in the case of executing the diagnosis of the temperature detection circuit 91 or the diagnosis of the contact between the DUT 90 and the socket 30, the tester 10 outputs the third signal $S_3$ to the temperature controller 83 via the optical transmitter 24 and the optical receiver 81. The second switch 84 switches the input source of the temperature controller 83 to the temperature sensor 84 on the basis of this third signal $S_3$.

In a case where the junction temperature $T_j$ indicates an abnormal value, the second calculator 82 cannot accurately calculate the DUT temperature $T_j'$. For this reason, in a case where the junction temperature $T_j$ inputted from the load board 20 exceeds a predetermined threshold value, the tester 10 outputs the third signal $S_3$ to the temperature controller 83, and the second switch 84 switches the input source of the temperature controller 83 to the temperature sensor 84.

Alternatively, in a case where the DUT 90 is of a type that does not self-heat rapidly, the tester 10 may output the third signal $S_3$ to the temperature controller 83, and the second switch 84 may switch the input source of the temperature controller 83 to the temperature sensor 84.

The third calculator 85 controls the actuator 712 of the flow rate adjustment unit 71 of the temperature adjuster 70 so that the difference between the DUT temperature $T_j'$ calculated by the second calculator 82 and the set point $T_{SP}$ as the target temperature is minimized. As a specific control method executed by the third calculator 85, for example, proportional-integral-differential (PID) control can be exemplified. In a case where the input source of the temperature controller 83 is switched to the temperature sensor 62 by the second switch 84, the third calculator 85 controls the temperature adjuster 70 so that the difference between the detection result $T_p$ of the temperature sensor 84 and the set point $T_{SP}$ is minimized.

Furthermore, in the embodiment, the third calculator 85 is connected to the fourth receiver 814 of the optical receiver 81 and can receive the fourth signal $S_4$ from the tester 10. Irrespective of the current temperature $T_j'$ of the DUT 90, the third calculator 85 controls the temperature adjuster 70 on the basis of the fourth signal $S_4$ so that the cooling of the DUT 90 is forcibly started.

As illustrated by a broken line in FIG. 4, depending on the type of the DUT 90, in a case where the DUT 90 self-heats rapidly in a short time, there is a case where the temperature adjustment of the DUT 90 is delayed by the control based on the DUT temperature $T_j'$ described above. On the other hand, the tester 10 predicts a temperature peak $T_{peak}$ at which the temperature of the DUT 90 rises during the test for the same type of the DUT 90, on the basis of the temperature profile $P_{temp}$ exhibiting the behavior of the temperature of the DUT 90 acquired through an actual test. The tester 10 may acquire the temperature profile $P_{temp}$ of the DUT 90 by simulation or the like based on the design value of the DUT 90.

Therefore, in the embodiment, as illustrated in FIG. 4, the tester 10 outputs the fourth signal $S_4$ to the third calculator 85 so that the cooling of the DUT 90 is forcibly started from the predetermined time period $\Delta t$ seconds before the temperature peak $T_{peak}$. Then, irrespective of the current temperature $T_j'$ of the DUT 90, the third calculator 85 controls the temperature adjuster 70 on the basis of the fourth signal $S_4$ so that the cooling of the DUT 90 is forcibly started at a timing earlier than the control based on the DUT temperature $T_j'$. With such a pre-trigger function, even though the DUT 90 is of a type that self-heats rapidly in a short time, the temperature peak $T_{peak}'$ of the DUT 90 can be lowered as illustrated by a solid line in FIG. 4 (that is, The temperature profile of the DUT 90 changes to $P_{temp}'$), and the temperature adjustment of the DUT 90 can be appropriately executed.

In accordance with the temperature profile $P_{temp}$ of the DUT 90, the third calculator 85 may control the temperature adjuster 70 on the basis of the fourth signal $S_4$ so that the heating the DUT 90 is forcibly started at a timing earlier than the control based on the DUT temperature $T_j'$.

Hereinafter, the operations of the electronic component testing apparatus 1 in the embodiment will be described.

When the DUT 90 is placed on the socket 30 by the handler 50, the pusher 60 presses the DUT 90 against the socket 30, so that the DUT 90 and the socket 30 are electrically connected to each other. Then, the tester 10 executes the test of the DUT 90.

While the test of the DUT 90 is not being executed (that is, a time between the tests), the tester 10 switches the first switch 21 so that the socket 30 is connected to the first calculator 22. As a result, the detection voltage signal of the temperature detection circuit 92 is inputted to the first calculator 22.

On the other hand, while the test of the DUT 90 is being executed, the tester 10 switches the first switch 21 so that the socket 30 is connected to the converter 23. As a result, the detection voltage signal of the temperature detection circuit 92 is inputted to the converter 23.

The test time period of the DUT 90 is longer than the time period between the tests. For this reason, as illustrated in FIG. 3, the time period $t_{on}$ during which the first switch 21 is turned on (that is, the time period during which the second signal $S_2$ is transmitted from the load board 20) is longer than the time period $t_{off}$ during which the first switch 21 is turned off (that is, the time period during which the first signal $S_1$ is transmitted from the load board 20).

Returning to FIG. 1, the first calculator 22 A/D-converts the detection voltage signal inputted via the socket 30 and the first switch 21 into a digital signal and performs a predetermined correction process on the detection voltage signal to generate the first signal $S_1$ (junction temperature $T_j$). The first signal $S_1$ is inputted to the second calculator 82 on the handler 50 side via the optical transmitter 24 and the optical receiver 81.

On the other hand, the converter 23 A/D-converts the detection voltage signal inputted via the socket 30 and the first switch 21 into a digital signal to generate a second signal $S_2$ (detection temperature $T_j$+c). The second signal $S_2$ is also inputted to the second calculator 82 of the handler 50 side via the optical transmitter 24 and the optical receiver 81.

Every time the second signal $S_2$ is inputted from the converter 23, the second calculator 82 calculates the current DUT temperature $T_j'$ in accordance with the above-described Mathematical Formula (1). In the embodiment, the first signal $S_1$ (junction temperature $T_j$) is successively corrected by using the second signal $S_2$ (detection temperature $T_j$+c) in accordance with the above-described Mathematical Formula (1).

Herein, as described above, since the test time period of the DUT is longer than the time period between tests, in a case where the DUT is a self-heating type such as a graphics processing unit (GPU) or the like, for example, in some cases, the temperature of the DUT may not be grasped irrespective of a large change in the temperature of the DUT during the test.

On the other hand, in the embodiment, as illustrated in FIG. 3, a cumulative error ($\Sigma\Delta T_j$) obtained from a time series of the second signal $S_2$ (detection temperature $T_j$+c) is added to the first signal $S_1$ (junction temperature $T_j$), and the DUT temperature $T_j'$ is calculated on the basis of the first signal $S_1$. As a result, as illustrated by the solid line in FIG. 3, the temperature $T_j'$ of the DUT 90 can be grasped with high accuracy almost in real time.

Every time the first signal $S_1$ is inputted from the first calculator 22 (namely, every time the junction temperature $T_j$ is calculated by the first calculator 22), the second calculator 82 resets the junction temperature $T_j$ in the above-described Mathematical Formula (1) and initializes the cumulative error ($\Sigma\Delta T_j$), and after that, calculates the above-described Mathematical Formula (1).

Figure 5:
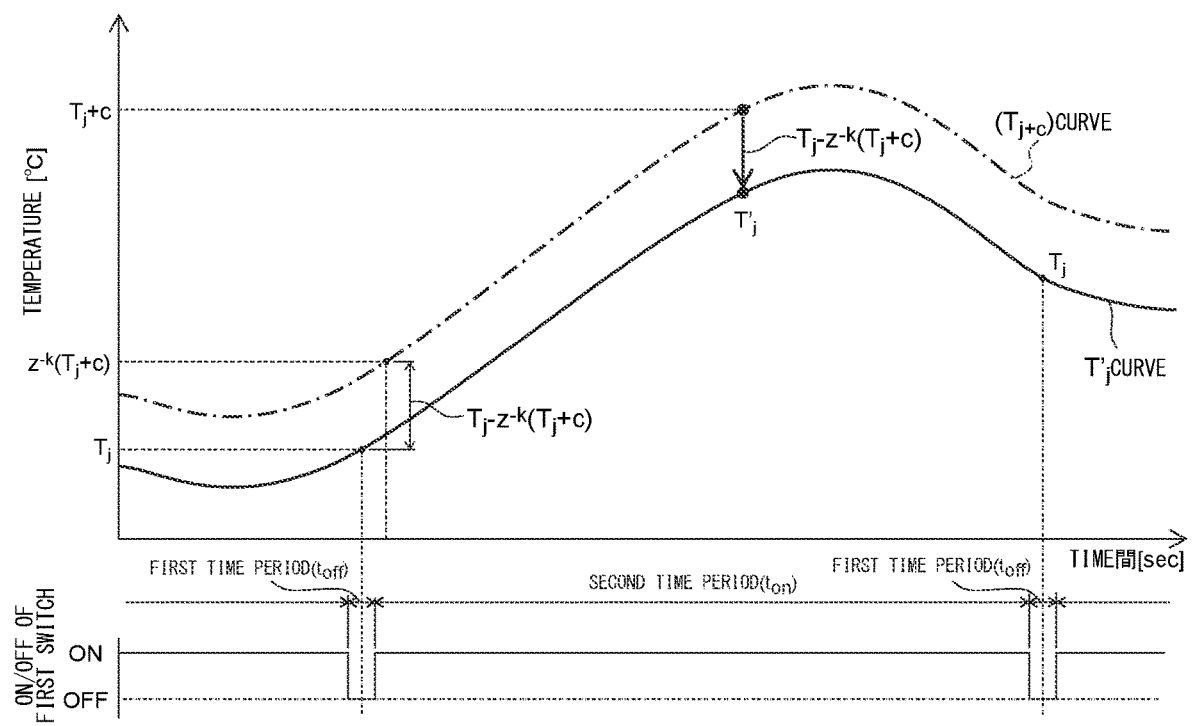
FIG. 5 is a view illustrating a modified example of the method of calculating the DUT temperature $T_j'$ in the embodiment of the invention.

Instead of the above-described Mathematical Formula (1), the second calculator 82 may calculate the DUT temperature $T_j'$ in accordance with the following Mathematical Formula (2). In Modified Example, the second signal $S_2$ (detection temperature $T_j$+c) is successively corrected by using the first signal $S_1$ (junction temperature $T_j$) in accordance with following Mathematical Formula (2). FIG. 5 is a view illustrating a method of calculating the DUT temperature $T_j'$ in accordance with the following Mathematical Formula (2).

[Mathematical Formula 2]

$$T_j'=(T_j+c)+\{T_j-z^{-k}(T_j+c)\} \quad (2)$$

In the above-described Mathematical Formula (2), $(T_j+c)$ indicates the latest sampled detection temperature, $T_j$ indicates the junction temperature immediately before turning on the first switch 21, and $z^{-k}(T_j+c)$ indicates the detection temperature sampled immediately after turning on the first switch 21.

In this example, as illustrated in FIG. 5, by calculating a difference between the first signal $S_1$ (junction temperature $T_j$) immediately before turning on the first switch 21 and the second signal $S_2$ ($z^{-k}(T_j+c)$) immediately after turning on the first switch 21 and by adding the difference to the latest second signal $S_2$ (detection temperature $T_j$+c), the DUT temperature $T_j'$ is calculated on the basis of the second signal $S_2$. As a result, as illustrated by the solid line in FIG. 5, the temperature $T_j'$ of the DUT 90 can be grasped with high accuracy almost in real time.

As described above, in the embodiment, the load board 20 includes the optical transmitter 24 capable of transmitting a signal by optical wireless communication to the optical receiver 81 of the handler 50. For this reason, since the attaching/detaching operation of the cable is unnecessary in the first place, it is possible to suppress a decrease in operation rate of the electronic component testing apparatus 1.

In the embodiment, since the first signal $S_1$ indicating the junction temperature $T_j$ of the DUT 90 and the second signal $S_2$ indicating the detection value ($T_j$+c) of the temperature detection circuit are transmitted from the load board 20 close to the DUT 90 rather than the tester 10 to the handler 50 side, the temperature control of the DUT 90 can be performed at a high speed and with high accuracy.

Furthermore, in the embodiment, by using the first signal $S_1$ indicating the junction temperature $T_j$ of the DUT 90 and the second signal $S_2$ indicating the detection value ($T_j$+c) of the temperature detection circuit, the current temperature $T_j'$ of the DUT 90 is calculated. For this reason, even though the DUT 90 is of a type that self-heats rapidly in a short time, it is possible to grasp the temperature of the DUT 90, and it is possible to improve the test quality.

The above-described embodiment is used to facilitate the understanding of the invention and does not limit the invention. Thus, the components disclosed in the above-described embodiment include all modifications in design and equivalents belonging to the technical scope of the invention.

For example, in the above-described embodiment, the signal is transmitted from the optical transmitter 24 of the load board 20 to the optical receiver 81 of the handler 50 in one direction, but the invention is not particularly limited thereto. For example, the optical communication unit on the load board 20 side may be capable of receiving a signal, and the optical communication unit on the handler 50 side may be capable of transmitting a signal. Alternatively, both the load board 20 and the handler 50 may have an optical communication unit capable of transmitting and receiving signals.

The signal transmitted from the optical transmitter 24 of the load board 20 to the optical receiver 81 of the handler 50 is not limited to the above-described first to fourth signals $S_1$ to $S_4$. Although not particularly limited, for example, the signal transmitted from the tester 10 to the handler 50 may be transmitted to the handler 50 via the optical transmitter 24 and the optical receiver 81. Alternatively, the signal transmitted from the handler 50 to the tester 10 may be transmitted from the optical communication unit on the handler 50 side to the optical communication unit on the load board 20 side.

EXPLANATIONS OF LETTERS OR NUMERALS

1 ELECTRONIC COMPONENT TESTING APPARATUS
10 TESTER
20 LOAD BOARD
21 FIRST SWITCH
21a INPUT TERMINAL
21b, 21c OUTPUT TERMINAL
22 FIRST CALCULATOR
23 CONVERTER
24 OPTICAL TRANSMITTER
241 to 244 FIRST TO FOURTH TRANSMITTERS
30 SOCKET
31 CONTACT
50 HANDLER
60 PUSHER
61 INTERNAL SPACE
62 TEMPERATURE SENSOR
70 TEMPERATURE ADJUSTER
71 FLOW RATE ADJUSTMENT UNIT
711 VALVE
712 ACTUATOR
72 REFRIGERANT SUPPLY UNIT
73 HOT MEDIUM SUPPLY UNIT
80 CONTROL DEVICE
81 OPTICAL RECEIVER
811 to 814 FIRST TO FOURTH RECEIVERS
82 SECOND CALCULATOR
83 TEMPERATURE CONTROLLER
84 SECOND SWITCH
84a, 84b INPUT TERMINAL
84c OUTPUT TERMINAL
85 THIRD CALCULATOR
90 DUT
91 MAIN CIRCUIT
92 TEMPERATURE DETECTION CIRCUIT
93 INPUT/OUTPUT TERMINAL

The invention claimed is:

1. A load board to which a socket is mounted and which is electrically connected to a tester, comprising a first optical communication unit that transmits and/or receives signals by optical wireless communication with an electronic component handling apparatus that handles a DUT and presses the DUT against the socket, wherein the signals include a signal concerning a detection value of a temperature detection circuit included in the DUT.

2. The load board according to claim 1, wherein the first optical communication unit transmits a first signal indicating a junction temperature of the DUT and transmits a second signal indicating the detection value of the temperature detection circuit included in the DUT.

3. The load board according to claim 2, wherein the load board includes:
a calculator that calculates the junction temperature from the detection value of the temperature detection circuit and outputs the junction temperature to the first optical communication unit;
a converter that A/D-converts the detection value of the temperature detection circuit and outputs the A/D-converted detection value to the first optical communication unit; and
a first switch that switches a connection destination of the temperature detection circuit to the calculator or the converter.

4. An electronic component testing apparatus comprising:
the load board according to claim 1 to which a socket is mounted;
a tester that is electrically connected to the load board and tests a DUT; and
an electronic component handling apparatus that handles the DUT and presses the DUT against the socket, wherein
the electronic component handling apparatus includes a second optical communication unit that receives and/or transmits the signals by optical wireless communication with the first optical communication unit, and
the second optical communication unit is provided in the electronic component handling apparatus such that the first and the second optical communication units face each other.

5. An electronic component testing apparatus comprising:
a load board to which a socket is mounted;
a tester that is electrically connected to the load board and tests a DUT; and
an electronic component handling apparatus that handles the DUT and presses the DUT against the socket, wherein
the load board comprises a first optical communication unit that transmits and/or receives signals by optical wireless communication with the electronic component handling apparatus,
the electronic component handling apparatus includes a second optical communication unit that receives and/or transmits the signals by optical wireless communication with the first optical communication unit,
the second optical communication unit is provided in the electronic component handling apparatus such that the first and the second optical communication units face each other, and
the electronic component handling apparatus includes:
a temperature adjuster that adjusts the temperature of the DUT;
a calculator that calculates the temperature of the DUT by using the signals received by the second optical communication unit from the first optical communication unit; and
a temperature controller that controls the temperature adjuster by using a calculation result of the calculator.

6. The electronic component testing apparatus according to claim 5, wherein
the electronic component handling apparatus includes a temperature sensor provided in a pusher contacting the DUT,
the first optical communication unit transmits a third signal outputted from the tester,
the second optical communication unit receives the third signal from the first optical communication unit, and the temperature controller controls the temperature adjuster based on the third signal by using the calculation result of the calculator or a detection value of the temperature sensor.

7. The electronic component testing apparatus according to claim 6, wherein the temperature controller includes a second switch that switches an input source to the temperature controller to the calculator or to the temperature sensor.

8. The electronic component testing apparatus according to claim 5, wherein
the first optical communication unit transmits a fourth signal outputted from the tester,
the second optical communication unit receives the fourth signal from the first optical communication unit, and
the temperature controller controls the temperature adjuster based on the fourth signal so that cooling or heating of the DUT is forcibly started.

9. The electronic component testing apparatus according to claim 5, wherein
the first optical communication unit transmits a first signal indicating a junction temperature of the DUT and transmits a second signal indicating a detection value of a temperature detection circuit included in the DUT, and
the calculator calculates the temperature of the DUT by correcting the first signal by using the second signal.

10. The electronic component testing apparatus according to claim 5, wherein
the first optical communication unit transmits a first signal indicating a junction temperature of the DUT and transmits a second signal indicating a detection value of a temperature detection circuit included in the DUT, and
the calculator calculates the temperature of the DUT by correcting the second signal by using the first signal.

* * * * *